United States Patent
Mainguet et al.

(10) Patent No.: US 10,144,586 B2
(45) Date of Patent: Dec. 4, 2018

(54) RECEPTACLE INTERACTING WITH A USER WITH REDUCED ENERGY CONSUMPTION BEFORE UNPACKING

(71) Applicant: COMMISSARIAT A L'ENERGIE ATOMIQUE ET AUX ENE ALT, Paris (FR)

(72) Inventors: Jean-Francois Mainguet, Grenoble (FR); Gorka Arrizabalaga, Lans en Vercors (FR); Miguel Aubouy, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 183 days.

(21) Appl. No.: 14/583,967

(22) Filed: Dec. 29, 2014

(65) Prior Publication Data

US 2015/0191309 A1     Jul. 9, 2015

(30) Foreign Application Priority Data

Jan. 6, 2014   (FR) .................................... 14 50049

(51) Int. Cl.
  *G06M 7/00*   (2006.01)
  *B65G 1/137*  (2006.01)
  (Continued)

(52) U.S. Cl.
  CPC ............. *B65G 1/137* (2013.01); *A45D 34/02* (2013.01); *H03K 17/941* (2013.01);
  (Continued)

(58) Field of Classification Search
  CPC .... B65G 1/137; H03K 17/962; H03K 17/941; A45D 34/02
  (Continued)

(56) References Cited

U.S. PATENT DOCUMENTS 6,664,887 B1 * 12/2003 Fuchs .................... B65D 81/24
                                                340/309.16
7,948,283 B2 * 5/2011 Tseng ..................... H03K 17/20
                                                327/143
(Continued)

FOREIGN PATENT DOCUMENTS

DE    20 2004 013 766 U1   3/2005
DE    10 2004 034 585 A1   2/2006
EP       2 572 603 A1      3/2013

OTHER PUBLICATIONS

U.S. Appl. No. 13/542,939, filed Jul. 6, 2012, 2013-0175942, Mainguet.

*Primary Examiner* — Thanh Luu
*Assistant Examiner* — Kevin Wyatt
(74) *Attorney, Agent, or Firm* — Oblon, McClelland, Maier & Neustadt, L.L.P.

(57) ABSTRACT

The invention relates to a receptacle for storage of an object, containing a proximity sensor capable of detecting an action by a user close to or in contact with a surface of the receptacle, a transducer and a control circuit comprising an input coupled to the proximity sensor and an output connected to the transducer, the control circuit being configured to generate a control signal to be sent to the transducer when a user action is detected by the proximity sensor, characterized in that it also comprises an unpacking detector coupled to the control circuit and in that the control circuit is also configured to changeover from a standby mode during which it periodically awakens to query the unpacking detector, to a detection mode during which it periodically checks the state of its input coupled to the proximity sensor, after the unpacking detector has detected removal of the receptacle from a packaging.

11 Claims, 1 Drawing Sheet

(51) Int. Cl.
   *H03K 17/96* (2006.01)
   *H03K 17/94* (2006.01)
   *A45D 34/02* (2006.01)
   *A45D 34/00* (2006.01)

(52) U.S. Cl.
   CPC ..... *H03K 17/962* (2013.01); *A45D 2034/007* (2013.01); *A45D 2200/057* (2013.01)

(58) Field of Classification Search
   USPC .......................................................... 250/221
   See application file for complete search history.

(56) References Cited

U.S. PATENT DOCUMENTS

| | | | | |
|---|---|---|---|---|
| 8,255,724 B2 * | 8/2012 | Das | ...................... | G06F 1/3203 455/574 |
| 2005/0206769 A1 | 9/2005 | Kump et al. | ............. | 348/333.01 |
| 2005/0252259 A1 * | 11/2005 | Ekstrom | ................ | B65D 90/00 70/257 |
| 2006/0053315 A1 * | 3/2006 | Menzl | ................... | G06F 1/3203 713/300 |
| 2006/0276161 A1 * | 12/2006 | Twitchell | .............. | H04W 36/14 455/343.1 |
| 2007/0164857 A1 * | 7/2007 | Odenwald | ............... | G06Q 10/08 340/539.22 |
| 2012/0268017 A1 * | 10/2012 | Griffiths | ............ | H05B 37/0218 315/152 |
| 2013/0175942 A1 | 7/2013 | Mainguet | | |

* cited by examiner

RECEPTACLE INTERACTING WITH A USER WITH REDUCED ENERGY CONSUMPTION BEFORE UNPACKING

TECHNICAL FIELD

The invention relates to receptacles, and particularly receptacles that are aimed at containing fluid and interacting with a user, for example such as perfume flasks equipped with lighting triggered under the control of the user.

STATE OF PRIOR ART

Receptacles are used particularly to store consumer products such as drinks or perfumes. For example, perfumes are usually distributed in flasks fitted with caps that prevent uncontrolled spilling of the stored perfume. There is an increasing demand for the flask to interact with the user, for example generating a light signal when the user manipulates the flask. For example, such flasks are required to differentiate one type of perfume from the competition.

One known flask comprises a cap and a lighting by a light emitting diode. When a cap switch is actuated, the light emitting diode emits a light signal. Such lighting has relatively limited functions. In particular, the light intensity emitted by such a flask does not take account of the distance from the user because it is based on an all-or-nothing mode. Secondly, such a flask does not generate light except when the user acts on the cap and cannot create differentiated lighting for manipulation of other zones of the flask. Furthermore, such lighting only reacts to the actuation of a switch and not respond to simpler actions such as simply holding the flask.

One solution to these problems consists of replacing the switch by a proximity detector, for example a capacitive detector, capable of detecting a user action close to or in contact with a surface of the receptacle. The proximity detector is then associated with a control circuit that generates a control signal to execute a light sequence following detection of an action by the proximity detector.

However, it would be desirable if, after unpacking the flask from its packaging, the user could initiate execution of a light sequence when for example he touches a part called the hoop that covers the shoulder of the flask, but without needing to take any particular action (or without him realizing it), in order to start the proximity detection and lighting during the first use.

This implies that the proximity detection and lighting system is already under power and active during unpacking. The problem then arises of the life of the batteries that are of the button battery type and necessarily small, while the flask may remain packed up to an entire year. The battery energy is thus unduly shortened before the consumer starts to use it, necessarily limiting the life of the luminous flask when it is between the user's hands.

The different life phases are as follows. In a first so-called manufacturing phase, the electronic board supporting the control circuit and the proximity detector is manufactured but no power has yet been applied to it. Some tests are carried out on it and it is then placed in an appropriate package ready to be assembled. In a second so-called assembly phase, the electronic board is assembled with so-called plastic cladding parts and the batteries, and is tested. Energy consumption begins. In a third so-called bottling phase, also called the conditioning phase, the hoop containing the board is assembled with the filled flask and its pump, and the complete assembly is then inserted in a so-called secondary packaging. In a fourth so-called storage phase, the packaged assembly is stored, transported and put on shelves in the distribution circuit and waits until it is open at the end user. In a fifth so-called unpacking phase, the user unpacks the flask and the proximity detection and lighting system can then begin automatically because power has already been switched on since the assembly phase. In a sixth so-called usage phase, a light sequence takes place at each contact with the hoop.

PRESENTATION OF THE INVENTION

The purpose of the invention is to solve this problem of unwanted consumption during the phases before the unpacking and usage phases. To achieve this, it discloses a means of saving battery energy between when a receptacle interacting with a user is manufactured and when it is first used by the user, and more precisely discloses a receptacle for storage of an object containing a proximity sensor capable of detecting an action by a user close to or a user in contact with a surface of the receptacle, a transducer and a control circuit comprising an input that can be coupled to the proximity sensor and an output connected to the transducer, the control circuit being configured to generate a control signal to be sent to the transducer when a user action is detected by the proximity sensor. The receptacle further comprises an unpacking detector coupled to the control circuit, the control circuit being also configured to switch from a standby mode during which it periodically awakens to query the unpacking detector to a detection mode during which it periodically checks the state of its input that can be coupled to the proximity sensor, after the unpacking detector has detected removal of the receptacle from a packaging.

The invention also relates to a method of managing the energy consumption of such an object storage receptacle, wherein the control circuit is switched from a standby mode during which it periodically awakens to query the unpacking detector to a detection mode during which it periodically checks the state of its input that can be coupled to the proximity sensor, after the unpacking detector has detected removal of the receptacle from a packaging.

BRIEF DESCRIPTION OF THE DRAWINGS

Other aspects, purposes, advantages and characteristics of the invention will become clear after reading the following detailed description of preferred embodiments of the invention given as non-limitative examples with reference to the appended drawings in which.

DETAILED PRESENTATION OF PARTICULAR EMBODIMENTS

Figure 1:
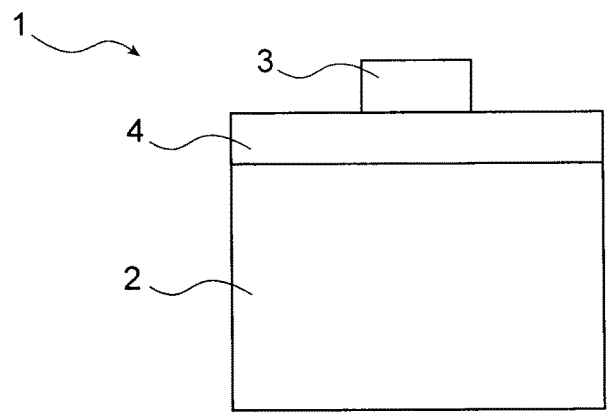
FIG. 1 is a front view of a receptacle 1 for storage of an object according to one possible embodiment of the invention.

FIG. 1 is a front view of a receptacle 1 for storage of an object according to one possible embodiment of the invention. In the example described, the object is a powder or a cosmetic fluid such as perfume or cream. Although the examples described above apply most specifically to a flask, the invention is obviously applicable to any other receptacle such as a bottle that will contain a drink, a pot containing a cream, or a case enclosing an object.

The receptacle 1 comprises a container 2 that will receive the object, a cap 3 and a cladding part 4 called the hoop of the container 2 that covers the upper part and has a central orifice through which a neck of the container fitted with a pump passes, possibly covered with a pump cover, another cladding part masking the pump orifice (not shown).

Figure 2:
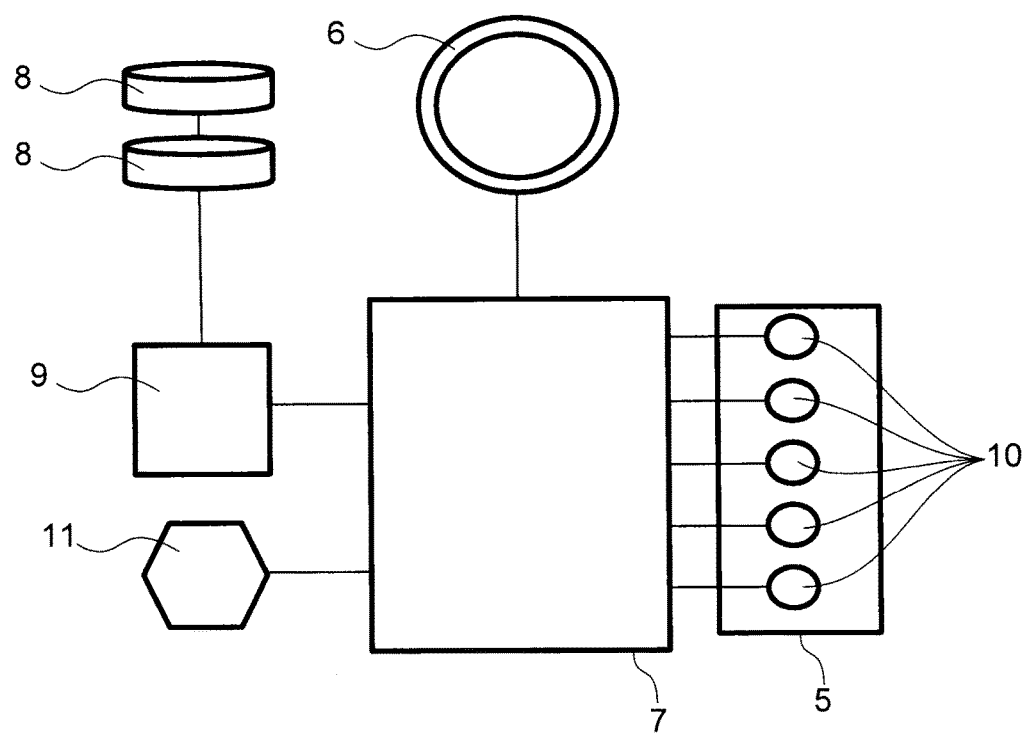
FIG. 2 is a diagram showing the components integrated into a cladding part of the container that is aimed to receive the object in one possible embodiment of the invention.

With reference to FIG. 2, there are one or several transducers 5, one or several proximity sensors 6 capable of detecting an action of a user close to or in contact with a surface (the top or lateral surface of the cladding part 4 in this example) of the receptacle, integrated into the cladding part 4, and a control circuit 7 comprising one or several inputs each that can be either electrically or capacitively coupled to a proximity sensor and one (or several) outputs each connected to a transducer, the control circuit being configured to generate a control signal to be sent to a transducer when a user action is detected by a proximity sensor. The cladding part 4 also contains a battery, for example in the form of button batteries 8, for the electrical power supply to the control circuit 7, the proximity sensor 6, the transducer 5 and possibly a voltage regulator 9.

The transducer may for example be a loudspeaker, an actuator or a light source, for example with light emitting diodes 10. The proximity detector may be a capacitive proximity detector, for example formed from an electrically conducting metallic chip deposited on the inside surface of the cladding part 4, and connected to the control circuit 7. We will now consider the example of a light source controlled by interaction between a user and a capacitive proximity sensor, although this is not limitative.

The control circuit in the invention is configured so that it can changeover between several functional modes in which its energy consumption is not the same. The control circuit can thus operate in a standby mode in which in it consumes little, or in a detection mode in which it consumes more.

The switching between these operating modes is made by means of an unpacking detector 11 fitted on the receptacle according to the invention. The control circuit is thus more precisely configured so that it switches from a standby mode during which it awakens periodically to query the unpacking detector to a detection mode, during which it periodically checks the state of its input coupled to the proximity sensor, the switching being performed after the unpacking detector has detected removal of the receptacle from a packaging.

The awaken period in standby mode is longer than the checking period in detection mode, typically by a factor of at least ten and preferably by a factor of at least a hundred.

In standby mode, the control circuit awakens periodically, for example every 20 seconds, to look at the state of the unpacking detector. During the short awaken period, the consumption increases drastically (milliamperes) but it remains short (milliseconds) and therefore the global energy used remains low. This awakening only concerns monitoring of the state of the unpacking detector. Thus, the state of the proximity sensor is not monitored in standby mode.

In detection mode, the control circuit periodically checks the state of the proximity detector for example every tenth of a second, and decides whether or not a light sequence should be started. Preferably, it monitors slow variations of the capacitance in order to limit any unwanted starts if there are any variations in environmental conditions. In this detection mode, it is possible for the state of the unpacking sensor not to be monitored.

Electricity consumption is maximum when a light sequence takes place, and the control circuit runs up at full speed. During execution of the sequence, it periodically checks if the user is still in contact or nearby in order to prolong the sequence. If user contact/proximity is no longer detected, it terminates the light sequence, switches itself off and inhibits contact detection for one second (for example) before returning to detection mode. If the light sequence lasts for too long (for example more than one minute), the light sequence may be stopped arbitrarily and a calibration may be made for safety purposes, for example if an unwanted trip occurs solely due to an environmental variation.

Therefore, it can be understood that the invention can achieve low consumption during phases preceding use of the receptacle by a user, in other words before the receptacle is removed from its packaging.

An example of an unpacking detector is a magnetic detector controlled by the control circuit, for example a reed relay or a magnetometer. This magnetic detector interacts with a magnet placed in the packaging. The control circuit then operates in standby mode. When the receptacle is removed from the packaging, this interaction is broken and the control circuit then changes over to detection mode.

The unpacking detector may also be in the form of a distance detector in order to measure the distance between the receptacle and its packaging, for example an ultrasound or induction detector.

Another example of an unpacking detector that can be used is a light detector arranged on the receptacle in order to be able to detect ambient light, such as a phototransistor, a PIN diode or an infrared level detector that generally measures ambient light for compensation purposes. A flask packaging is typically composed of cardboard that will not transmit light, and the light sensor is therefore located in the dark before the user withdraws the flask from the packaging.

One possible set up consists of a series association of a phototransistor with a resistance, the control circuit periodically observing the voltage at the terminals of the resistance by powering the series association when in standby mode. If there is any light, the phototransistor conducts current and the voltage observed will be transmitted to the ground. The value of the resistance is used to adjust the threshold as a function of the characteristics of the phototransistor. Preferably, a high resistance value is used (for example 500 kΩ or 1 MΩ) to be able to detect a low light level. This set up may also be refined, for example using several resistances powered sequentially to detect different luminosity levels. In particular, this provides a means of adjusting the intensity of the light source 10 by adjusting its average current using the control circuit 7.

In one possible embodiment, when the unpacking detector is in the form of a light detector, the control circuit may also be configured so that after the receptacle has been withdrawn from the packaging, it changes over from detection mode to standby mode if the unpacking detector does not detect any light during a determined period, and to change back into detection mode after light has been detected by the unpacking detector.

Thus, a "no light for 2 days" or "no light for 2 hours" type storage criterion can be defined. In detection mode, the control circuit 7 thus counts the time elapsed since the last time that the light detector saw any light, and if the determined time expiration criterion is satisfied, the control circuit changes back into standby mode. Starting from this moment, the control circuit awakens periodically to query the light detector and if necessary changes over once again to detection mode.

In another possible embodiment, when the unpacking detector is in the form of a light detector, the control circuit may also be configured to increase the period at which a verification is made of the state of the input coupled to the proximity sensor if no light is detected by the unpacking detector, when the control circuit is in detection mode.

When it is found that the luminosity is null, for example because the flask is stored in a cupboard, then the instants at which the state of the input coupled to the proximity sensor 6 is checked can be made at longer intervals, to reduce energy consumption. A return to the initial verification period can then be made when non-zero luminosity is observed by means of the light detector, for example when the flask is taken out of the cupboard.

In another embodiment, the control circuit 7 may also be configured so that in detection mode, the verification period of the state of the input coupled to the proximity sensor 6 can be increased after a determined duration following detection of a user action by the proximity sensor.

When a light sequence has just taken place, the probability of a new detection occurring just afterwards is very high. But it is probable that after a certain time, for example about ten minutes, the next detection will not occur until for example the next day. Thus, this frequent type of use can advantageously justify an increase in the detection verification period with time. It is also possible to return to the initial verification period after expiration of a predetermined duration, for example after 24 hours in order to allow for daily use.

In another embodiment, the control circuit 7 may be configured so that an action history can be learned in detection mode, and the verification period of the state of the input coupled to the proximity sensor can be modified in time, as a function of this learning.

The control circuit 7 can thus learn the habits of the user, for example it can learn that the receptacle is frequently used within a given time period. The control circuit can then define the verification period as a function of this usage history, by increasing this period during time periods with frequent use and reducing it during other time periods.

In another embodiment, the control circuit 7 may be configured so that in standby mode, the awakening period is modified to query the unpacking detector, for example gradually reducing it.

For example, after the assembly phase in which energy consumption begins, it may be decided to have a fairly long awaken period in the first days and then to reduce it, for example progressively.

This modification to the awaken period may also use information from the light detector to detect the bottling phase. The awaken period may then be modified to use a fairly high value in the next few days after bottling and then to reduce it, for example progressively.

In another embodiment, the control circuit may be configured to change over from a sleep mode in which querying of the unpacking detector 11 is inhibited in comparison with standby mode.

For example, the control circuit 7 enters sleep mode after the assembly phase, for example during two days. After this inhibition duration, the control circuit enters standby mode to monitor unpacking, for example by means of light detection. During the bottling phase, the light detection can be sufficient to switch the control circuit into the sleep mode, typically for an inhibition period corresponding to the minimum storage duration. After this duration, the control circuit enters the standby mode.

In another example, the change over between sleep mode and standby mode is made by a particular action for example performed during the bottling phase. A special light flash that is detected by the light detector may be emitted during this phase. Considering the example of the phototransistor once again, it is possible to use a resistance other than that used for detection of unpacking so that the light detection threshold is sufficiently high so that it cannot be confused with the threshold used for detection of unpacking. As a variant, an electromagnetic pulse with a specific frequency may be emitted during the bottling phase, this pulse being detected by a special purpose antenna or by the proximity sensor. According to yet another variant, an electrical contact, for example a simple short circuit between two tracks on the control circuit, is made to initiate this changeover from sleep mode to standby mode. According to yet another variant, a plastic or cardboard part, for example acting as a provisional protection packaging, is removed or simply displaced during assembly of the hoop on the flask. This part acts as a light cache to the light detector. When it is removed or displaced, the control circuit becomes aware that this is the moment at which the bottling is made. Alternately, the part may include an electrical track that will be broken or folded during assembly of the hoop on the flask, which causes a contact or an open contact, detected by the control circuit.

In another example, the change over between sleep mode and standby mode is made at the stage of the sale. For example, the vendor will have an activation instrument similar to an instrument used to deactivate an anti-theft label, including an RFID type antenna that will transmit sufficient energy to interrupt the control circuit and to start it, or using an antenna transmitting a special signal.

In yet another example, the receptacle may include a container that will contain the object, a container cladding part (typically a hoop) in which the control circuit and a container and cladding part assembly detector coupled to the control circuit 7 are integrated. The control circuit is then configured to change over from sleep mode to standby mode when the assembly detector detects assembly of the container and the cladding part.

If the container and the cladding part are designed to be separable during use, as is the case for example for a pot of cream and its lid, the control circuit is configured so that it will memorize the first assembly to remain in detection mode and not change over to standby mode, after a new assembly for example when the pot of cream is closed by screwing the lid on.

The assembly detector may in particular be in the form of a light detector, for example a phototransistor, arranged so that it will be concealed after assembly with the pump and possibly its pump cache during the bottling phase. Detection of an absence of light detects that the recipient is in the bottling phase so that the control circuit changes over to standby mode. The assembly detector may also be in the form of a magnetometer that interacts with a magnet during the bottling phase.

The assembly detector may also stop a light sequence during execution when the cover is separated from the flask, to avoid blinding the user when light emitting diodes are directly visible in this configuration.

The invention is not limited to the receptacle as disclosed above, but also includes a process for management of the energy consumption of such a receptacle in accordance with the different embodiments disclosed above and particularly a method in which a control circuit switches from a standby mode in which it awakens periodically to query the unpacking detector into a detection mode in which it periodically checks the state of its input coupled to the proximity sensor, after it has been detected that the receptacle has been removed from a packaging.

The invention claimed is:

1. A receptacle for storage of an object, comprising:
a proximity sensor configured to detect an action by a user close to or in contact with a surface of the receptacle;
a transducer;
a control circuit coupled to the proximity sensor and to the transducer, the control circuit being configured to generate a control signal to the transducer when a user action is detected by the proximity sensor; and
an unpacking detector coupled to the control circuit and configured to detect removal of the receptacle from a packaging,
wherein upon detection of removal of the receptacle from the packaging by the unpacking detector, the control circuit is further configured to switch from a standby mode during which the control circuit periodically awakens to query the unpacking detector to a detection mode during which the control circuit periodically checks a state of the proximity sensor,
in the standby mode, the control circuit changes a length of an awake period during which it awakens to query the unpacking detector, and
wherein the control circuit is also configured to progressively reduce the awake period to query the unpacking detector, in the standby mode.

2. The receptacle according to claim 1, wherein the unpacking detector is a magnetic detector.

3. The receptacle according to claim 1, wherein the unpacking detector is a light detector.

4. The receptacle according to claim 3, wherein the control circuit is further configured to switch, after the receptacle has been withdrawn from the packaging, from the detection mode to the standby mode after the unpacking detector has not detected any light during a determined period, and to switch back to the detection mode after light is detected by the unpacking detector.

5. The receptacle according to claim 3, wherein the control circuit is also configured to increase a period at which a verification is made of the state of the proximity sensor if no light is detected by the unpacking detector, when the control circuit is in the detection mode.

6. The receptacle according to claim 1, wherein the control circuit is also configured so that in the detection mode, a verification period of the state of the proximity sensor is increased after a determined duration following detection of a user action by the proximity sensor.

7. The receptacle according to claim 1, wherein the control circuit is also configured to learn an action history in the detection mode, and a verification period of the state of the proximity sensor is modified in time as a function of learning of the action history by the control circuit.

8. The receptacle according to claim 1, wherein the control circuit is also configured to change over from a sleep mode in which querying of the unpacking detector is inhibited to the standby mode.

9. A receptacle for storage of an object, comprising:
a proximity sensor configured to detect an action by a user close to or in contact with a surface of the receptacle;
a transducer;
a control circuit coupled to the proximity sensor and to the transducer, the control circuit being configured to generate a control signal to the transducer when a user action is detected by the proximity sensor; and
an unpacking detector coupled to the control circuit and configured to detect removal of the receptacle from a packaging,
wherein upon detection of removal of the receptacle from the packaging by the unpacking detector, the control circuit is further configured to switch from a standby mode during which the control circuit periodically awakens to query the unpacking detector to a detection mode during which the control circuit periodically checks a state of the proximity sensor, and
in the detection mode, the control circuit monitors variations in signals from the proximity sensor in order to compensate for environmental conditions,
wherein the receptacle further includes:
a container configured to contain the object;
a container cladding part in which are integrated the control circuit and a container; and
a cladding part assembly detector coupled to the control circuit, the control circuit being configured to switch from a sleep mode in which querying of the unpacking detector is inhibited to standby mode when the assembly detector detects assembly of the container and the cladding part, and
wherein the control circuit is also configured to change over from the sleep mode to the standby mode.

10. The receptacle according to claim 1, further comprising a container containing a cosmetic product, which is at least one of a perfume or cream, and in which the proximity sensor is a capacitive sensor and the transducer is a light source, the lighting of which is controlled by the control signal generated by the control circuit.

11. A method of managing the energy consumption of an object storage receptacle, comprising:
detecting, by a proximity sensor, an action of a user close to or in contact with a surface of the receptacle,
detecting, by an unpacking detector, removal of the object storage receptacle from a packaging;
switching, by a control circuit and when the unpacking detector detects removal of the object storage receptacle from the packaging, from a standby mode during which the control circuit awakens periodically to query the unpacking detector to a detection mode, during which the control circuit periodically checks the state of its input that can be coupled to the proximity sensor, the control circuit changing a length of an awake period during which it awakens to query the unpacking detector in the standby mode; and
generating, by the control circuit in the detection mode, a control signal to control a transducer when user action is detected by the proximity sensor; and
wherein the awake period to query the unpacking detector is progressively reduced in the standby mode.

* * * * *